(12) United States Patent
Bianchi

(10) Patent No.: US 11,402,423 B2
(45) Date of Patent: Aug. 2, 2022

(54) OPERATING COMPONENT

(71) Applicant: Siemens Energy Global GmbH & Co. KG, Munich (DE)

(72) Inventor: Roberto Bianchi, Erlangen (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 401 days.

(21) Appl. No.: 15/831,676

(22) Filed: Dec. 5, 2017

(65) Prior Publication Data

US 2018/0156858 A1  Jun. 7, 2018

(30) Foreign Application Priority Data

Dec. 5, 2016 (DE) .................. 102016224121.4

(51) Int. Cl.
*G01R 31/327* (2006.01)
*G01R 31/08* (2020.01)
*H02J 11/00* (2006.01)
*H02J 13/00* (2006.01)
*G01R 31/62* (2020.01)

(52) U.S. Cl.
CPC ......... *G01R 31/088* (2013.01); *G01R 31/086* (2013.01); *G01R 31/3274* (2013.01); *G01R 31/3275* (2013.01); *H02J 11/00* (2013.01); *H02J 13/0013* (2013.01); *G01R 31/62* (2020.01); *Y02B 90/20* (2013.01); *Y04S 40/12* (2013.01)

(58) Field of Classification Search
CPC ............... G01R 31/008; G01R 31/086; G01R 31/3274; G01R 31/3275; G01R 31/62; H02J 11/00; H02J 13/0013; Y02B 90/2607; Y04S 40/12
See application file for complete search history.

(56) References Cited

U.S. PATENT DOCUMENTS

| 5,859,596 A * | 1/1999 | McRae ............. H02J 13/00028 340/870.02 |
| 2003/0205938 A1* | 11/2003 | Andarawis ............... H02H 7/30 307/11 |
| 2004/0162705 A1 | 8/2004 | Grieb et al. |
| 2005/0168891 A1* | 8/2005 | Nilman-Johansson ..................... H01H 11/0062 361/23 |
| 2008/0100436 A1 | 5/2008 | Banting et al. |
| 2008/0177425 A1* | 7/2008 | Korba ................... H02J 3/1814 700/297 |
| 2010/0145641 A1* | 6/2010 | Bose ..................... G01R 31/327 702/58 |

(Continued)

FOREIGN PATENT DOCUMENTS

DE  2315322 A  9/1974
DE  10154482 A1  5/2003
(Continued)

*Primary Examiner* — Mohamed Charioui
*Assistant Examiner* — Christine Y Liao
(74) *Attorney, Agent, or Firm* — Laurence A. Greenberg; Werner H. Stemer; Ralph E. Locher

(57) ABSTRACT

An operating component has a sensor device for recording measurement values and a communication device for transmitting a status report. A data storage device stores the recorded measurement values and a status estimation device determines an operating status with the aid of the recorded measurement values.

13 Claims, 2 Drawing Sheets

(56) References Cited

U.S. PATENT DOCUMENTS

2015/0308938 A1* 10/2015 Scheucher ......... G01N 33/0006
73/1.06

FOREIGN PATENT DOCUMENTS

| | | |
|---|---|---|
| DE | 102007035129 A1 | 1/2009 |
| DE | 102009041781 A1 | 3/2011 |
| DE | 102012208444 A1 | 11/2013 |
| DE | 102013105444 A1 | 5/2014 |
| DE | 202013011810 U1 | 9/2014 |
| DE | 102013007239 A1 | 10/2014 |
| EP | 0960456 B1 | 12/2005 |
| WO | 2009012952 A3 | 1/2009 |
| WO | 2010124707 A1 | 11/2010 |
| WO | 2011076242 A1 | 6/2011 |
| WO | 2013174589 A1 | 11/2013 |
| WO | 2014075970 A2 | 5/2014 |

* cited by examiner

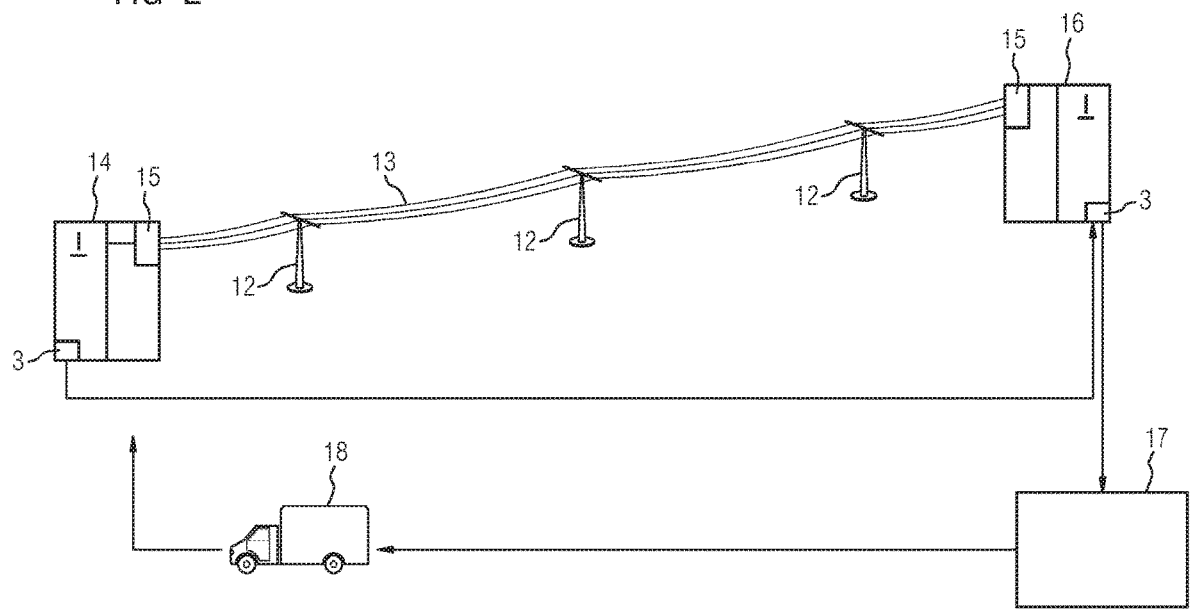

OPERATING COMPONENT

BACKGROUND OF THE INVENTION

Field of the Invention

The invention relates to an operating means having a sensor device for recording measurement values and a communication device for transmitting a status report.

Power networks are an important part of our infrastructure, and play a central part both in the supply of households and in the provision of power for industrial uses. The availability of power supply is correspondingly very important for all energy consumers. The availability of a supply of power is influenced by the availability of a multiplicity of different operating means, for example electrical switchgear.

To date, most networks have been configured with a relatively high redundancy. The availability of the overall network is correspondingly not dependent directly on individual operating means, because in the event of a problem a redundant operating means can perform the function of the defective operating means. This strategy of (N−1) availability often entails large extra costs (for example duplication of high-voltage transformers and high-voltage connections). Many operators of power networks and operating means are increasingly subject to economic pressure, as a result of which high redundancy can no longer be ensured comprehensively.

One alternative to the redundant provision of operating means is to monitor the operating status, in particular the operational readiness, by means of "monitoring systems". These systems are centrally installed and receive measurement values of the individual operating means in the power network, with the aid of which values the occurrence of faults can be identified promptly and appropriate countermeasures can be initiated. In the case of a gas-insulated switchgear, for example, a gas density of the protective gas may be monitored. Serious problems are therefore avoided, and the availability of the monitored operating means is increased. Unfortunately, monitoring systems are cost-intensive and therefore not very widespread. Moreover, the use of a monitoring system requires trained personnel, who constantly track the analyses of the monitoring system and, when appropriate, initiate actions, for example a maintenance request.

BRIEF SUMMARY OF THE INVENTION

On the basis of prior operating means, it is an object of the invention to specify an operating means whose operating status can be monitored comparatively simply and economically.

The invention achieves this object by an operating means as claimed.

Owing to the use of the data storage device and the status estimation device directly in situ, i.e. in the operating means, the need for central monitoring or a central status monitoring system is avoided. The operating means is to a certain extent provided with its own "intelligence", in order to monitor itself. The respective status is continuously observed and evaluated.

All known data storage media may be used as the data storage device, for example hard drives or solid-state disks (SSDs).

The status monitoring device may on the one hand be configured to compare the present measurement values with previously stored, design-specific threshold values, and correspondingly to initiate a status report when the threshold values are fallen below or exceeded. On the other hand, the status estimation device may analyze trends with the aid of the measurement values stored in the data memory, and for example make predictions about the expected evolution of the measurement values. A status report may therefore already be initiated when a threshold value is expected to be fallen below or exceeded in the near future. This is an advantage because the availability of the operating means is increased.

The status report contains, for example, the current and/or predicted operating status. The status report may furthermore contain detailed information, for example the date of first use, manufacturer and type of operating means, serial number, etc.

In the simplest case, the operating means transmits only binary information about the operating status, namely for example 0—operationally ready and 1—maintenance required. This is a significant simplification of the management of multiple operating means for the operator, who with previous technology would have had to keep a relatively elaborate monitoring system in operation. To date, sensors and monitoring systems have mostly been retrofitted, which entails significant outlay for the installation.

Depending on the configuration of the communication link, however, relatively large amounts of data may also be transmitted, so that the operating status can be transmitted in substantially more detail, for example also broken down according to modules. It is advantageous in particular for each operating means to be provided with a unique identifier, for example a manufacturer-independent address in the manner of a MAC address or an IP address, and for it to transmit this in its status report.

In the scope of the operating status, the status report may for example contain the instantaneous load, present configuration, geographical position, internal and/or external temperature and also aggregate data (for example $i^2 t$ or switching cycles in the case of a power switch, disconnector or grounding electrode). Measurement values such as partial discharge strength or gas density for switchgear, dissolved gas analyses for transformers, etc. may also be transmitted directly in the status report. These measurement values are then available to a manufacturer or maintenance service provider for more accurate evaluation.

In one preferred embodiment of the operating means according to the invention, the status estimation device is configured to predict a future profile of the operating status.

In another preferred embodiment of the operating means according to the invention, the operating means comprises an electrical switchgear having a motor control, the motor control being configured as a status estimation device. This is an advantage because the motor control, which per se is already planned for, generally has sufficient computing means to be able to take on the further function of status estimation as well. This double function is very economical, since in contrast to previous operating means the additional provision of a data input and a data output is sufficient. The status estimation may, for example, be fully implemented in software.

In another preferred embodiment of the operating means according to the invention, the sensor device is configured to record at least one of the following measurement values: current in the trip circuit, number of switching actions of a disconnector or grounding electrode, opening times of a power switch, gas pressure of a gas-insulated switchgear, load, internal temperature, temperature on an external surface, ambient temperature.

In another preferred embodiment of the operating means according to the invention, the operating means is configured to archive all recorded measurement values in the manner of a flight recorder, so that faults can be traced and monitored with the aid of a complete operating means history. The data memory is used for this purpose. In addition, all operating statuses determined may furthermore be stored. The storage of measurement values, and optionally operating statuses, is an advantage because conclusions for improved future operating means may be drawn by the operator or manufacturer with the aid of the complete data history. The data may either be read out when replacing the unit or even interrogated during operation by means of the communication device. Until now, it has been scarcely possible for manufacturers of operating means to collect such complete information over the entire lifetime of the operating means, with the aid of which weaknesses of the technology may be identified. In a manner corresponding to the functionality of a flight recorder, and depending on the data storage capacity of the data memory, a time window of a few weeks in the past may for example be stored completely.

In another preferred embodiment of the operating means according to the invention, the communication device is configured to provide data communication by means of at least one of the following methods: WLAN, LAN, mobile telephony, powerline communication, Bluetooth, 6LoWPAN.

In another preferred embodiment of the operating means according to the invention, the status estimation device is configured to identify required maintenance of the operating means with the aid of the operating status, and to provide a status report by means of the communication device for an operator of the operating means and/or for a maintenance service provider. The operator of the operating means is, for example, an energy supplier or a distribution network operator. A maintenance service provider may, for example, also be assigned to a manufacturer. In the event of a deteriorating operating status, the status report may for example be initiated by overload operation, the reaching of maximum mechanical lifetimes, or a gas leak with a corresponding pressure drop.

In contrast thereto, the "intelligent" operating means is very economical because as an additional functionality, in the case of a large production run of operating means, it can be already installed very economically ex factory. It ultimately represents a fusion of primary and secondary technology with monitoring.

In another preferred embodiment of the operating means according to the invention, the operating means is configured to receive and forward a status report of another operating means. This is an advantage because, even in areas without a radio link, it is consequently not necessary to resort to cable connections or powerline communication that needs to be installed additionally, but instead the operating means function as a network for one another.

In another preferred embodiment of the operating means according to the invention, the operating means comprises a position detection device for determining the geographical position of the operating means. This is an advantage because the operating means can transmit the installation site in the status report and therefore facilitate maintenance by a service provider or by the manufacturer.

In another preferred embodiment of the operating means according to the invention, the operating means transmits its geographical position. This is an advantage because the operating means may for example receive the installation site by its being stored during installation at the operating site, and then jointly transmit this position, for example in a message concerning required maintenance.

In another preferred embodiment of the operating means according to the invention, the operating means comprises a power switch.

In another preferred embodiment of the operating means according to the invention, the operating means comprises a transformer.

In another preferred embodiment of the operating means according to the invention, the operating means comprises a flexible alternating-current transmission system (FACTS).

In another preferred embodiment of the operating means according to the invention, the operating means comprises a protective unit.

In another preferred embodiment of the operating means according to the invention, at least one further sensor device having an associated further data memory is provided. This is an advantage because a plurality of modules can be monitored separately by means of a sensor and data memory. Such a modular design often allows simplified interoperability between different variants of an operating means. In this case, for example, the data may be evaluated in a common status estimation device.

BRIEF DESCRIPTION OF THE SEVERAL VIEWS OF THE DRAWING

For better explanation of the invention,

FIG. 2 shows an arrangement comprising a plurality of operating components.

DESCRIPTION OF THE INVENTION

Figure 1:
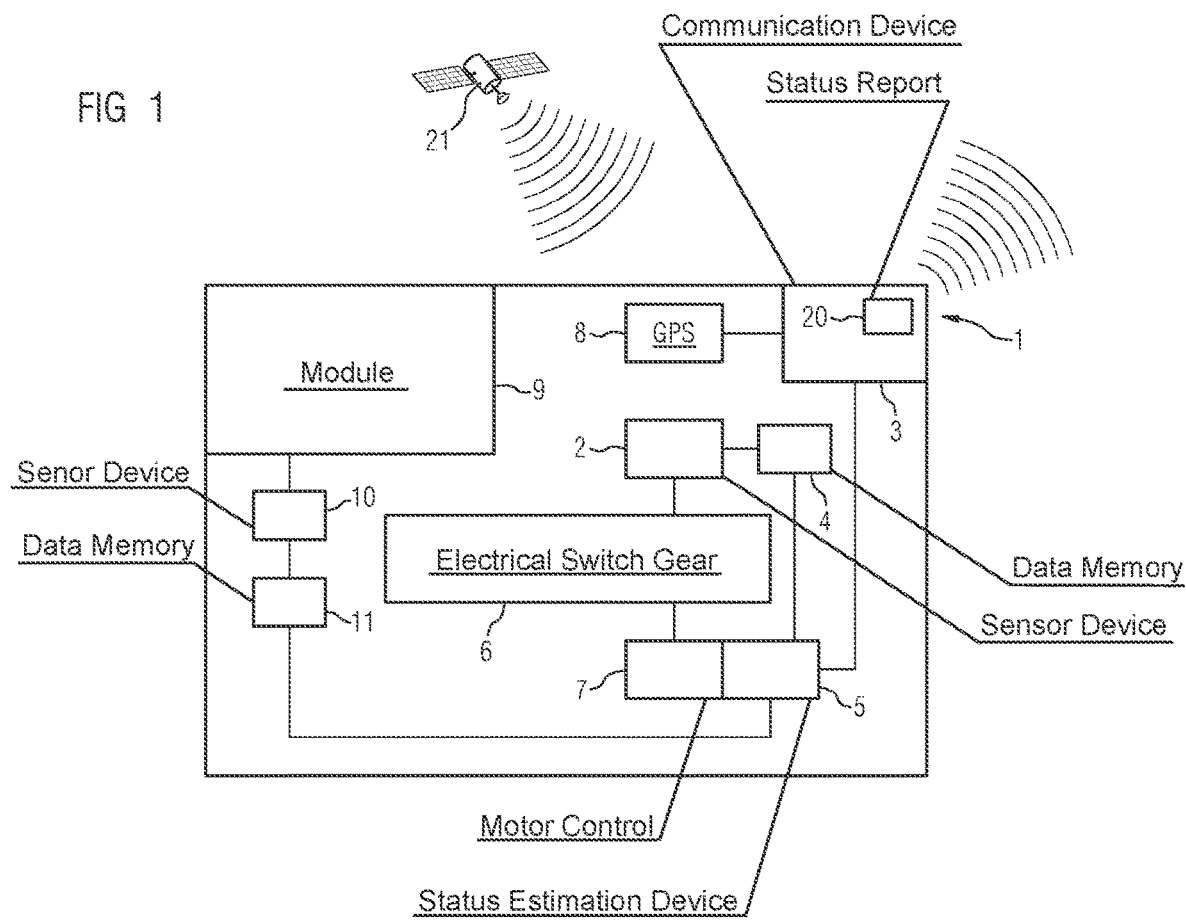
FIG. 1 shows an operating component according to the invention.

FIG. 1 shows an operating means 1 according to the invention. The operating means 1 comprises an electrical switchgear 6 having a motor control 7. The electrical switchgear 6 is monitored by a sensor device 2. The sensor device 2 records measurement values, for example a temperature in the switchgear 6, number of switching actions and opening times of the power switch. The measurement values collected are archived in a data memory 4, which is configured as a conventional hard drive. The data memory records the entire measurement value history of the operating means in the manner of a flight recorder, so that this can be used for more extensive analyses.

The measurement values are evaluated in a status estimation device 5, which is part of the motor control 7. The status estimation device 5 may, for example, be provided as a software component inside the motor control. With the aid of the measurement values recorded, the status estimation device 5 determines the operating status of the electrical switchgear 5. On the basis of this, a status report 20 is generated, which may be sent by means of a communication device 3, for example via a radio link. The status report 20 contains at least one information item about the current operating status, i.e. for example in the simplest case a binary signal. In this case, the status report contains, for example, the value 0 for operationally ready and 1 for maintenance required. The status report either may be sent only in the event of a fault, or periodic transmission of the operating status may be carried out. Periodic transmission, i.e. for example with one status report per day, has the advantage that an operator always receives positive information about operational readiness of their operating means.

A position detection device 8 is furthermore provided, which may establish the current position of the operating means 1 by means of GPS information, which is received from a satellite 21. The status report 20 may then respectively be supplemented with position information, so that the position of the operating means 1 is also transmitted.

Furthermore, the status report 20 may contain further details about the operating status or individual measurement values. A prediction of the operating status to be expected may furthermore be determined by means of the status estimation device and sent via the communication device 3. It is furthermore advantageous for identification of the operating means also to be inserted into the report 20 by means of the status estimation device 5, i.e. for example serial number, manufacturer and type of the operating means. A unique number is also conceivable and advantageous, for example a media access control (MAC) address, which has already been provided manufacturer-independently ex factory to all operating means. As an alternative, an IP address may also be used, although this needs to be adapted to the consumer network in order to allow unique allocation.

The operating means 1 shown comprises a further module 9, which is connected to a further sensor device 10 and a further data memory 11. This module 9 is therefore monitored separately, the evaluation of the measurement values of the module 9 also being carried out by the status estimation device 5. The latter may either determine an overall operating status or provide and transmit two different operating statuses for the electrical switchgear 6 and the further module 9.

It is a significant advantage of the present operating means that the intelligence, already present in the scope of the motor control 7, of an operating means is used in order to carry out autonomous status monitoring in situ. The need to transmit all measurement values to a central evaluation device, such as a monitoring system, and to analyze them there is avoided. Each operating means of this design can monitor itself and send a simple maintenance signal to the operator of the operating means or a maintenance service provider, if so required. The need to provide elaborate condition monitoring systems and correspondingly trained personnel is avoided, because each operating means is already provided with its own fully integrated status monitoring by the manufacturer.

FIG. 2 shows an arrangement having three high-voltage masts 12 and overhead lines 13, which connect two switch groups 14 and 16 to one another. The two switch groups 14, 16 respectively comprise a transformer 15 and an operating means 1 according to the invention with a communication device 3. In this embodiment, the operating means are configured to receive status reports of further operating means via their communication devices 3 and to forward these to a central evaluation device 17 at the premises of the operator or maintenance service provider. In the example shown, the central evaluation device 17 receives a status report of the switch group 14, which has been forwarded via the switch group 16. The status report contains a maintenance request, so that the central evaluation device 17 can send a maintenance team 18 to the switch group 14.

The invention claimed is:

1. An operating component for a power network, comprising:
   a sensor device for recording measurement values of an operation of the operating component;
   a communication device for transmitting a status report;
   a data storage device connected to said sensor device for storing the measurement values recorded by said sensor device;
   an electrical switchgear having a motor control, said motor control being configured as a status estimation device;
   said status estimation device connected to said data storage device for determining an operating status based on the recorded measurement values, said determination of an operating status being performed by said status estimation device local to the operating component, thus performing autonomous status monitoring, in situ;
   said status estimation device being configured to identify required maintenance of the operating component based on the operating status, and to provide a status report, without the recorded measurement values, by way of said communication device for an operator of the operating component and/or for a maintenance service provider, the operating component having a unique identifier and said status report including said unique identifier.

2. The operating component according to claim 1, wherein said status estimation device is configured to predict a future profile of the operating status.

3. The operating component according to claim 1, wherein said sensor device is configured to record at least one measurement value selected from the group consisting of a current in a trip circuit, a number of switching actions of a disconnector or grounding electrode, opening times of a power switch, a gas pressure of a gas-insulated switchgear, a load, an internal temperature, a temperature on an exterior surface and an ambient temperature.

4. The operating component according to claim 1, configured to archive all recorded measurement values, enabling faults to be traced and monitored within a complete measurement value history.

5. The operating component according to claim 1, wherein said communication device is configured to effect data communication by at least one method selected from the group consisting of WLAN, LAN, mobile telephony, power line communication, Bluetooth and 6LoWPAN.

6. The operating component according to claim 1, configured to receive and forward a status report of another operating component.

7. The operating component according to claim 1, which comprises a position detection device for determining a geographical position of the operating component.

8. The operating component according to claim 1, wherein the operating component comprises a power switch.

9. The operating component according to claim 1, wherein the operating component comprises a transformer.

10. The operating component according to claim 1, wherein the operating component comprises a flexible alternating-current transmission system.

11. The operating component according to claim 1, wherein the operating component comprises a protective unit.

12. The operating component according to claim 1, which comprises at least one further sensor device having an associated further data memory.

13. An operating component for a power network, comprising:
   a sensor device for recording measurement values of an operation of the operating component;
   a communication device for transmitting a status report;

a data storage device connected to said sensor device for storing the measurement values recorded by said sensor device;

an electrical switchgear having a motor control, said motor control being configured as a status estimation device;

said status estimation device connected to said data storage device and configured to evaluate the recorded measurement values and determine an operating status of the operating component based on the recorded measurement values, said determination of an operating status being performed by said status estimation device local to the operating component, thus performing autonomous status monitoring, in situ;

said status estimation device being configured to identify required maintenance of the operating component based on the operating status, and to provide a status report containing an evaluation of the operating status made by said status estimation device, by way of said communication device for an operator of the operating component and/or for a maintenance service provider, the operating component having a unique identifier and said status report including said unique identifier.

\* \* \* \* \*